United States Patent [19]
Schöniger et al.

[11] Patent Number: 6,028,815
[45] Date of Patent: Feb. 22, 2000

[54] INTEGRATED MEMORY

[75] Inventors: Sabine Schöniger; Peter Schrögmeier; Thomas Hein, all of München; Stefan Dietrich, Türkenfeld, all of Germany

[73] Assignee: Siemens Aktiengesellschaft, Munich, Germany

[21] Appl. No.: 09/258,940

[22] Filed: Mar. 1, 1999

[30] Foreign Application Priority Data

Feb. 27, 1998 [DE] Germany .......................... 198 08 347

[51] Int. Cl.⁷ .................................................. G11C 8/00
[52] U.S. Cl. .............................. 365/230.06; 365/230.03; 365/200; 365/63
[58] Field of Search .............................. 365/230.06, 200, 365/230.03, 63

[56] References Cited

U.S. PATENT DOCUMENTS 4,888,736  12/1989  Hasimoto et al. .
5,539,696   7/1996  Patel .
5,636,174   6/1997  Rao ..................................... 365/230.03
5,654,932   8/1997  Rao ................................. 365/230.06 X

*Primary Examiner*—Huan Hoang
*Attorney, Agent, or Firm*—Herbert L. Lerner; Laurence A. Greenberg; Werner H. Stemer

[57] ABSTRACT

The integrated memory has byte selection lines for selecting all the bit lines of a respective byte, as well as masking signals that are allocated to the respective byte of at least one word. In addition, the memory has a column decoder with outputs which are connected to the word selection lines, each of which, when addressed, causes all the byte selection lines for one of the words to be simultaneously selected if none of the masking signals are active. The masking signals, when activated, prevent the addressed word selection line from selecting the byte selection lines, allocated to a corresponding byte, for a corresponding word.

10 Claims, 6 Drawing Sheets

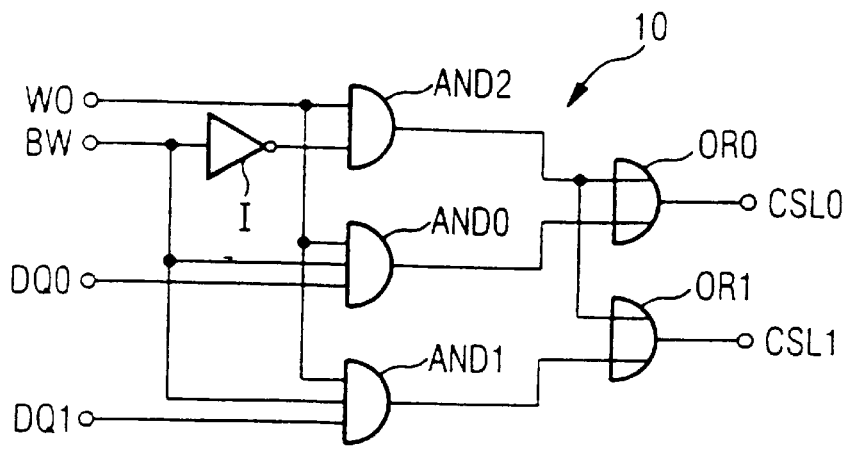
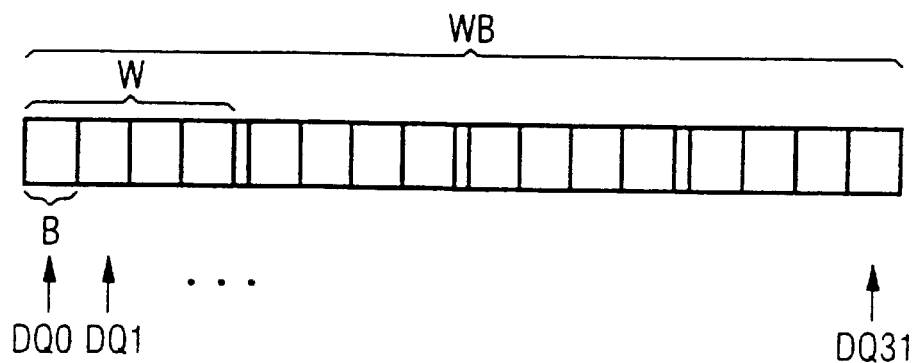
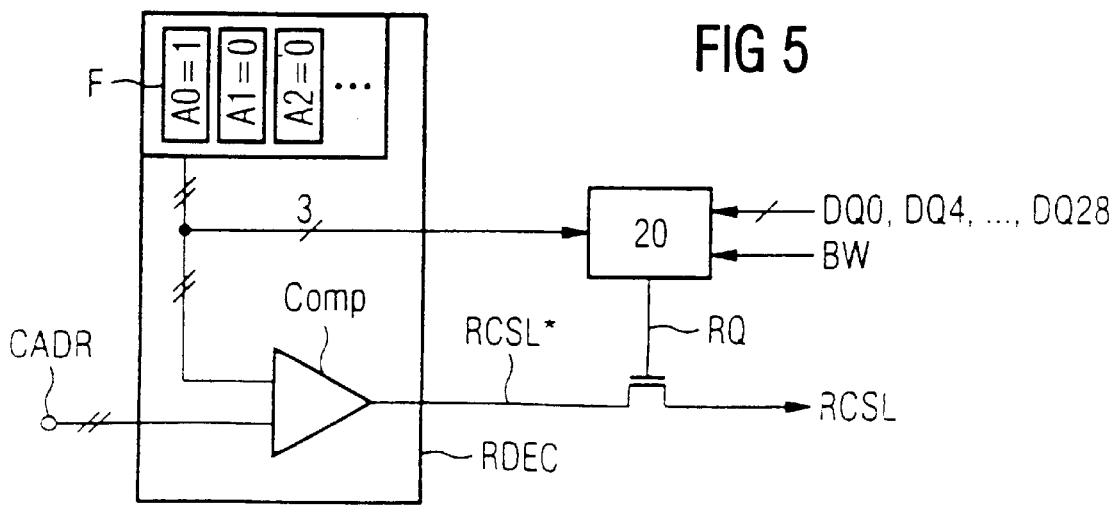

INTEGRATED MEMORY

BACKGROUND OF THE INVENTION

1. Field of the Invention

The invention relates to an integrated memory having memory cells, disposed at intersection points of word lines and bit lines, for storing data bits.

In memories of this type, a number of bits are combined to form bytes and a number of bytes are combined to form a respective word. In this case, a word is the data length of the memory interface, that is to say data having the length of a memory word can simultaneously be written to the memory or read from it.

In graphics applications, a screen may be required to show one and the same color over the whole surface. The screen is allocated an integrated memory whose content is in each case read for the purpose of producing the image on the screen. To show the same color over the whole surface of the screen, the same memory word must be written to all the addresses in the memory. To do this, it is possible to supply the appropriate word to the memory interface continuously and to write it to the whole memory successively by appropriate addressing.

However, in so doing, it may be desirable not to overwrite specific information stored in the memory. In this context, the term used is "masking".

Data sheet MT41LC256k32D4(S) from the company Micron, dated Jul. 1996, pp. 21–23, describes a 256k×32 SGRAM (synchronous graphics RAM) which allows byte-wise masking by appropriate masking signals. When a data word is being written, any desired bytes of the word can be masked by the masking signals, so that only the unmasked bytes of the word are written to the corresponding memory cells of the memory.

SUMMARY OF THE INVENTION

It is accordingly an object of the invention to provide an integrated memory that overcomes the above-mentioned disadvantages of the prior art devices of this general type, in which masking is carried out easily by the masking signals.

With the foregoing and other objects in view there is provided, in accordance with the invention, an integrated memory, including: word lines; bit lines intersecting the word lines; memory cells disposed at intersection points of and connected to the word lines and the bit lines for storing bits, a number of the bits in each case forming a byte and a number of bytes in each case forming a word; byte selection lines, each of the byte selection lines upon being addressed selecting all of the bit lines of a respective byte; masking decoders connected to the byte selection lines and generating byte addressing signals outputted on the byte selection lines for addressing the byte selection lines; masking signals received by the masking decoders and allocated to a respective byte in at least one of a multiplicity of words; word selection lines; a column decoder connected to the masking decoders via the word selection lines, the column decoder outputting word address signals on the word selection lines, if addressed, each of the word selection lines causing all of the byte selection lines for one of the multiplicity of words to be simultaneously selected if none of the masking signals are active; and each of the masking signals, if activated, preventing an addressed one of the word selection lines from selecting a respective byte selection line allocated to a corresponding byte of a corresponding word.

The integrated memory according to the invention has memory cells, disposed at intersection points of word lines and bit lines, for storing bits, a number of the bits in each case forming a byte and a number of the bytes forming a word. It also has byte selection lines for selecting all the bit lines for a respective byte, as well as masking signals that are allocated to a respective byte in at least one of the words. In addition, it has a column decoder with outputs which are connected to a respective word selection line, each of which, when addressed, causes all the byte selection lines for one of the words to be simultaneously selected if none of the masking signals is active, each masking signal, when activated, preventing the addressed word selection line from selecting the byte selection line, allocated to the corresponding byte, for the corresponding word.

The masking signals are therefore used to mask a respective one of the bytes of the word addressed by the column decoder. The masking causes selection of the corresponding byte selection line to be suppressed. In this way, it is possible to use the masking signals to specify, for a word which is to be written to the memory, which bytes of the word are written to the corresponding memory cells in the memory and which are not. If none of the masking signals is active, addressing by the column decoder will be used to write a respective complete word to the memory. Since each byte is allocated a byte selection line, it is possible to use the masking signals to prevent the appropriate bytes of the respectively addressed word from being selected. A word can then no longer be written to the memory in full, but instead only in part (that is to say its bytes which are not masked by the masking signals). The invention provides for the masking signals to act directly on the column decoding. The result of this is a simple embodiment that requires little space and enables rapid column decoding both with active and inactive masking signals.

According to one development of the invention, each of the byte selection lines is used to activate local write/read amplifiers that are used to transfer data from and to the associated bit lines. In this case, each masking signal, when activated, prevents the local write/read amplifier allocated to the corresponding byte from being activated by the respectively addressed word selection line by suppressing selection of the corresponding byte selection line.

Hence, depending on the masking signal, the local write/read amplifier for the respectively addressed word is deactivated. Therefore, no more data can be transferred from the global write/read amplifiers to the bit lines and from there to the corresponding memory cells, or in the opposite direction.

According to one development, the integrated memory has at least one redundant byte selection line which can be used to select redundant bit lines for a byte and which is used for replacing one of the byte selection lines having the associated bit lines. The memory also has a redundant masking decoder for producing a redundant masking signal depending on which, if it is addressed, selection of the redundant byte selection line is prevented. In this instance, the redundant masking decoder is supplied with at least some of the masking signals. The redundant masking decoder outputs the masking signal allocated to the byte selection line that is to be replaced as a redundant masking signal for the redundant byte selection line at its output.

If one of the byte selection lines or one of the bit lines allocated to it is faulty, it can be replaced, using addressing, by the redundant byte selection line having the corresponding redundant bit lines. The corresponding column address is then used to select the redundant byte selection line instead of the faulty byte selection line. The redundant masking signal, which corresponds, according to the invention, to the masking signal for the replaced byte selection line, allows masking according to the invention to work even when the redundant byte selection line is being used.

According to one development, a number of the words are in each case combined to form word blocks. Each masking signal is allocated to a respective one of the bytes at a specified position within each of the word blocks. The redundant byte selection line is used only to replace those byte selection lines that are allocated to a byte at a specified position within any desired one of the words. The redundant masking decoder is supplied only those masking signals that are allocated to the specified byte position within any desired one of the words.

This development has the advantage that decoding within the redundant masking decoder, which decoding is used to generate the redundant masking signal from the supplied masking signals, is less complex than if the redundant masking decoder is supplied with all the masking signals for all the byte positions. This restriction to a specified byte position is not a disadvantage, because a multiplicity of redundant byte selection lines are necessary anyway in practice.

According to one development, the memory has a redundancy decoder with storage elements for storing the address for the byte selection line that is to be replaced by the redundant byte selection line. In this instance, the redundant masking decoder allocates one of the masking signals supplied to it to the redundant masking signal by evaluating the address stored by the storage elements.

The redundant masking signal is thus produced by the redundant masking decoder as a function of the address programmed in the redundancy decoder. There is therefore no need for the redundant masking decoder to be programmed independently of the redundancy decoder. Nor is the user of the memory required to perform any additional programming steps; instead, the redundant masking decoder "programs" itself automatically.

According to one development, the redundant masking decoder allocates the masking signals to the redundant masking signal by evaluating only those bits of the address stored by the storage elements that indicate the number of that word, within any desired one of the word blocks, within which a byte selection line has in each case been replaced by the redundant byte selection line.

Since the redundant masking decoder is supplied only with those masking signals which respectively correspond to the same byte position in each of the words, the respectively relevant masking signal can be allocated by identifying that word whose byte is to be replaced. The address bits mentioned are adequate for this. Hence, a particularly simple configuration results for the redundant masking decoder.

According to one development, the memory has, for each byte position within any desired one of the words, at least one redundant byte selection line and a corresponding redundant masking decoder of the type described, each generator being supplied in each case only the masking signals corresponding to the respective byte position.

By selecting the appropriate redundant byte selection line, it is possible to replace a faulty byte selection line in any position within a word. It is merely necessary to ensure that the byte positions correspond in each case, so that the redundant masking decoder receives the correct masking signals.

According to one development, the redundant masking decoders have volatile storage units for storing the allocation of the redundant masking signal to one of the respectively supplied masking signals after the address bits stored by the storage elements have been evaluated.

This has the advantage that the redundant masking decoder needs to evaluate the addresses, stored by the storage elements, in the redundancy decoder only once in each case and not every time the redundant byte selection line is addressed. This results in a time saving for addressing. The one-off evaluation of addresses stored in the redundancy decoder and the subsequent storage in the volatile storage units of the redundant masking decoder can take place when the memory is started up, for example, as part of an initialization process.

According to one development, the memory has global write/read amplifiers which are each used, in a first mode of operation of the memory, to transfer data between a connection of the memory and at least one local write/read amplifier used to transfer the data in each case to one of the bit lines. A 1-bit color register is disposed immediately adjacent to each global write/read amplifier, the content of the color register being transferred, in a second mode of operation of the memory, to at least one of the local write/read amplifiers via the corresponding global write/read amplifier.

This has the advantage that the signal delay times when transferring the content of the color registers to the bit lines via the corresponding global amplifier are minimal.

According to one development, a masking register is disposed immediately adjacent to each global write/read amplifier for the purpose of storing a masking bit, depending on which bit the global write/read amplifier is deactivated when the corresponding color register is read, so that the content of said color register is not transferred to one of the local write/read amplifiers.

In contrast to the masking signals, which allow byte-wise masking, the masking bits allow bit-wise masking. Since they act directly on the global write/read amplifiers, access to the corresponding bit lines and memory cells is prevented. In the same way as the 1-bit color registers, the adjacent topological configuration of the 1-bit masking registers with regard to the respective global amplifier has the advantage that the signal delay times from these registers to the global write/read amplifiers which they might be intended to deactivate are minimal.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit diagram of a detail of FIG. 2 relating to a mask decoder;

FIG. 4 is a word block that is written to a memory simultaneously in a block-writing mode of operation;

FIG. 5 is a block circuit diagram of a detail from FIG. 1 relating to a selection of a redundant byte selection line;

DESCRIPTION OF THE PREFERRED EMBODIMENTS

Figure 1A:
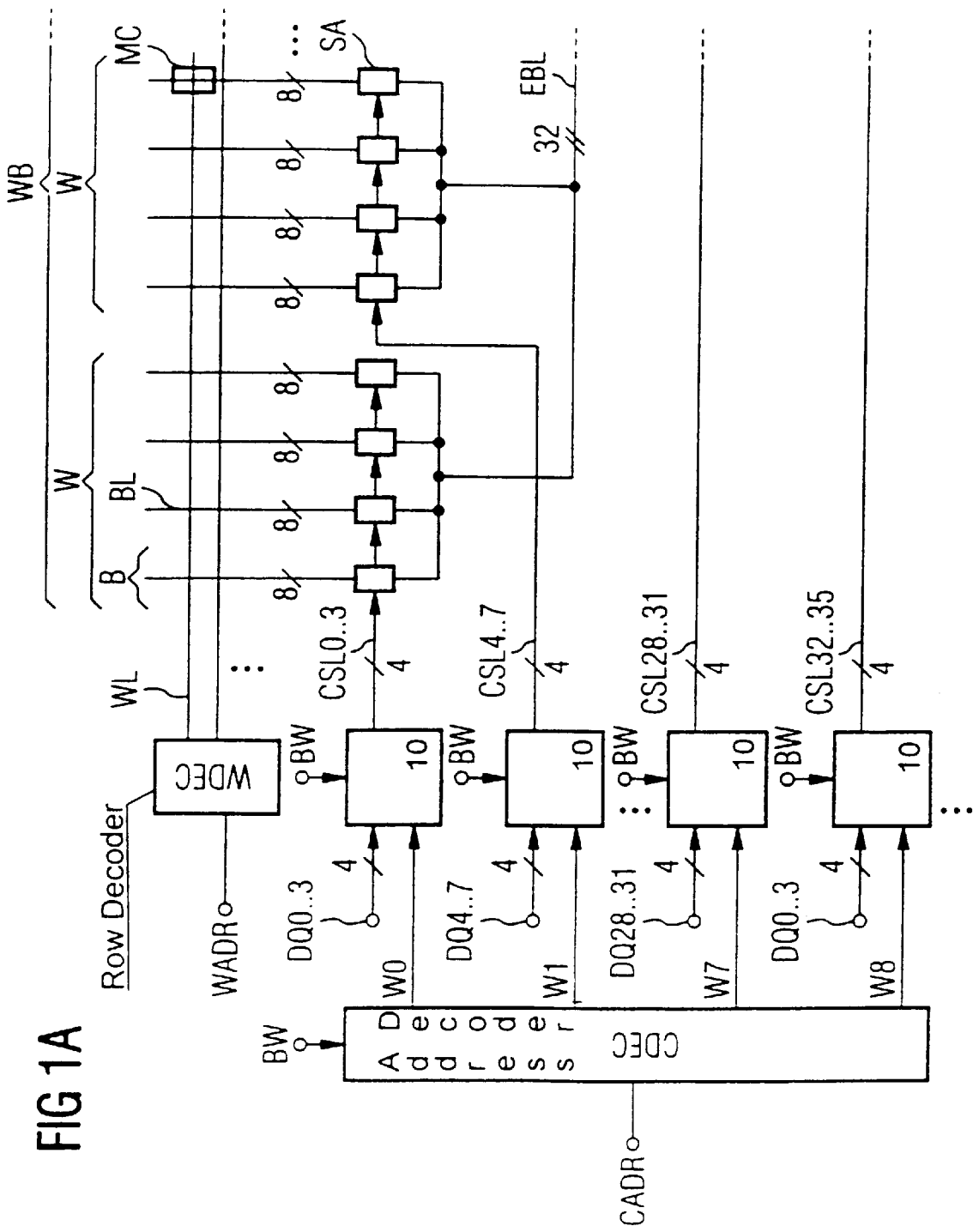
FIGS. 1A and 1B are diagrammatic block circuit diagrams of an exemplary embodiment of an integrated memory according to the invention.

In all the figures of the drawing, sub-features and integral parts that correspond to one another bear the same reference symbol in each case. Referring now to the figures of the drawing in detail and first, particularly, to FIGS. 1A and 1B thereof, there is shown an exemplary embodiment of the memory according to the invention. The memory has word lines WL and bit lines BL, at the intersection points of which memory cells MC are disposed which are used for storing one data bit each. The word lines WL can be addressed by a row decoder WDEC by applying row addresses WADR. The bit lines BL are addressed by a column decoder CDEC by applying column addresses CADR in a manner that is to be discussed further below. For the sake of clarity, only two word lines WL and single bit lines BL are shown. For the purpose of better illustration, in each case eight of the bit lines BL allocated to one byte B are shown combined in FIG. 1A.

Each bit line BL is connected to a local write/read amplifier SA that is used to amplify signals read from the memory cells MC. The eight respective bit lines BL for a byte B can be selected simultaneously by a respective byte selection line CSL0, CSL1, . . . , CSL35. They supply eight times one bit from the memory cells addressed simultaneously by the row decoder WDEC, that is t o say one byte.

In a normal mode of operation, external connections I/O and global write/read amplifiers SSA (see FIG. 2) as well as external bit lines EBL can each be used to write 32 bits, corresponding to one word W, to the memory, or to read them from it, at the same time. For this purpose, the memory has 32 external connections I/O and, for each external connection, a respective global write/read amplifier SSA and a respective external bit line EBL. The transferable data word length is thus 32 bits in the normal mode of operation, and so one memory word W includes 4 bytes.

The bit lines BL are combined to form groups of 32 bits lines in each case. In the normal mode of operation, a column address CADR is used to address all 32 bit lines for one of these groups. This is done by the corresponding byte selection lines CSL0 . . . 3, CSL4 . . . 7, . . . , CSL32 . . . 35 for the groups of 32 bit lines, respectively, always becoming active at the same time in the normal mode of operation. This is explained in even more detail further below with reference to FIG. 2.

To be able to transfer words having a length of 32 bits from and to the memory, each external bit line EBL is connected to a respective local write/read amplifier SA from each bit line group of 32 bit lines each. Which of the bit line groups supplies a data word W during reading, or to which bit line group a data word W is read during writing, is defined by the column address CADR. Depending on this address, the column decoder CDEC is used to select a word selection line W0, W1, . . . , W8 allocated to the respective bit line group. The word selection lines are connected to a respective masking decoder 10 whose outputs have the byte selection lines CSL0 . . . 35 connected to them. All the masking decoders 10 are supplied a block-writing signal BW that specifies whether the memory is in the normal mode of operation or in a block-writing mode of operation.

In the normal mode of operation, when one of the word selection lines is selected, all the associated byte selection lines are selected. For example, if the first word selection line W0 is selected, the associated byte selection lines CSL0,1, . . . 3 are selected. If a byte selection line is selected, this causes all eight local write/read amplifiers SA for the respective byte to be selected, so that these can be used to transfer data between the external bit lines EBL and the bit lines BL.

In addition, the masking decoders 10 are supplied with four respective masking signals DQ0 . . . 3, DQ4 . . .7, . . . , DQ28 . . . 31. FIG. 4 shows that, with the integrated memory of this exemplary embodiment, four respective bytes B, which are each allocated eight selected bit lines BL, are combined to form a word W. Eight of the words, that is to say thirty-two bytes B, form a word block WB. Each of the bytes B within the word block WB is allocated one of the thirty-two masking signals DQ0 . . . 31.

FIG. 1A likewise shows the allocation of the eight respective bit lines BL to one byte B, of four bytes B to one word W and of eight respective words W to one word block WB. This allocation continues with increasing column addresses CADR. The thirty-two masking signals DQ0 . . . 31 are allocated to a respective one of the byte selection lines CSL0 . . . 31 in each of the word blocks WB. Thus, the first four masking signals DQ0 . . . 3 are allocated both to the first four bytes B of the first word block WB or to the corresponding byte selection lines CSL0 . . . 3, as well as to the first four bytes within the second word block WB or to the corresponding byte selection lines CSL32 . . . 35.

If one of the masking signals DQ0 . . . 31 is activated in the block-writing mode of operation (which is to be discussed further below), when the corresponding word selection line W0 . . . 8 is selected, this causes the byte selection line CS0 . . . 35 allocated to this masking signal not to be selected. The associated local write/read amplifiers SA are then not activated, so that no data can be transferred from the external bit lines EBL to the corresponding bit lines BL for this byte. This process of masking is explained more precisely below with the aid of FIG. 2.

Figure 2:
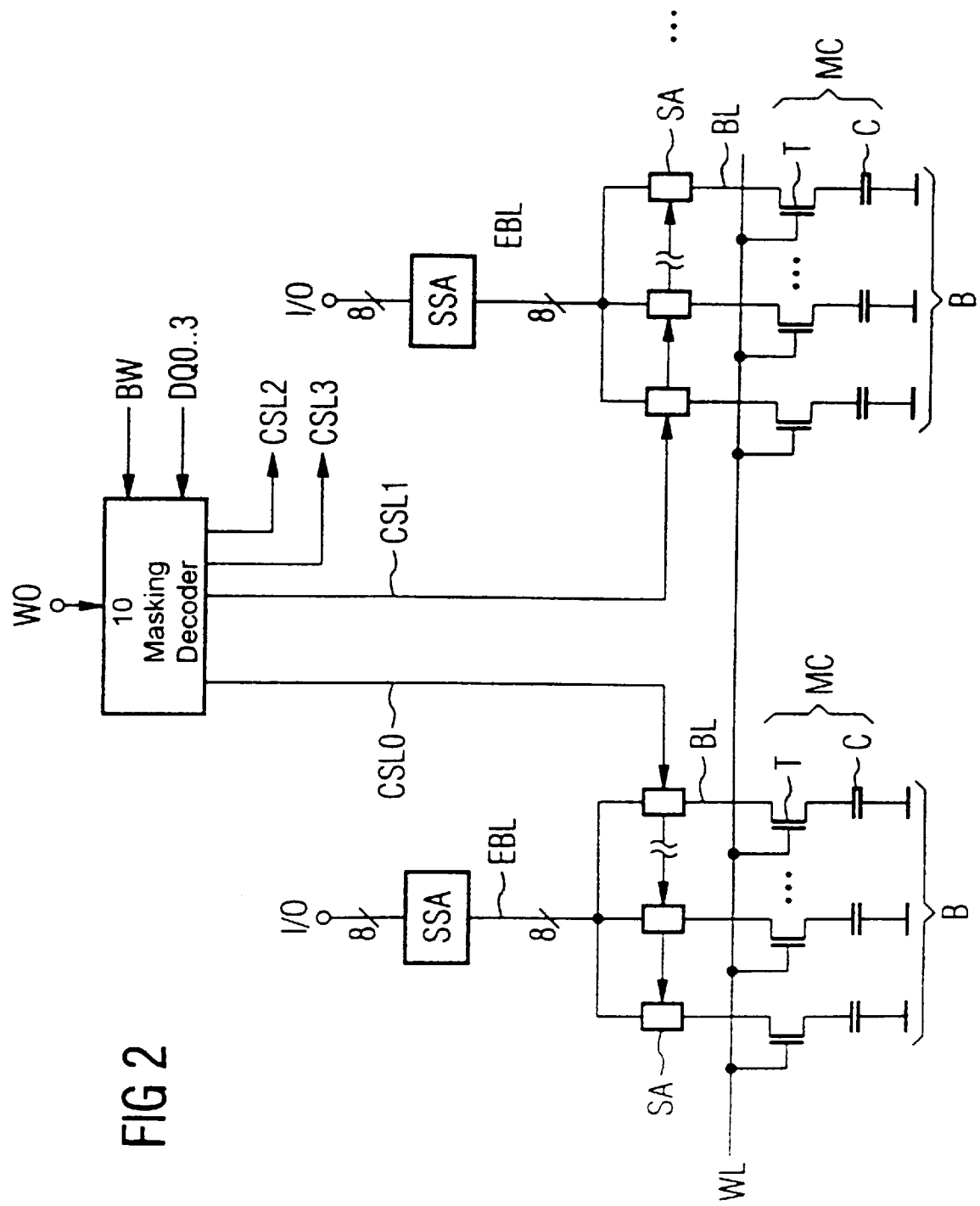
FIG. 2 is a block circuit diagram of a detail of FIG. 1 relating to column decoding.

FIG. 2 shows one of the word lines WL and the bit lines BL for the first two bytes B of the first word block WB as well as the masking decoder 10 allocated to them, from FIG. 1A. The masking decoder 10 is supplied the word selection line W0 from the column decoder CDEC. In addition, it is supplied the block-writing signal BW, used to define the mode of operation, and the first four masking signals DQ0 . . . 3. The output signals it supplies are the first four byte selection lines CSL0 . . . 3. A respective DRAM memory cell MC is disposed at the intersection point of the word line WL with the bit lines BL. Each memory cell MC has a selection transistor T, whose gate is connected to the word line WL, and a storage capacitor C disposed between the selection transistor T and ground. Each of the bit lines BL has a large number of such memory cells MC at intersection points with other word lines WL, which are not shown in FIG. 2.

Each bit line BL is connected via one of the local write/read amplifiers SA to a respective one of the external bit lines EBL and via these and a respective one of the global write/read amplifiers SSA to one of the external connections I/O. All eight local write/read amplifiers SA which are allocated to the bit lines BL for one byte B have one of the byte selection lines CSL0 . . . 3 connected to them, this being shown only for the first two byte selection lines CSL0, CSL1 in FIG. 2. The respective byte selection line causes the local write/read amplifiers SA to be activated as soon as the byte selection line is selected by the word selection line W0. Otherwise, the local amplifier is deactivated.

FIG. 3 shows part of the masking decoder 10 from FIG. 2. The illustration shows how the first two byte selection lines CSL0, CSL1 are selected by the word selection line W0 as a function of the block-writing signal BW and the masking signals DQ0, DQ1 allocated to them. If the block-writing signal BW is at low level (ground), the memory is in the normal mode of operation. In the normal mode of operation, all the byte selection lines CSL0, CSL1 allocated to the word selection line W0 selected using the column decoder CDEC are selected, specifically irrespective of the state of the masking signals DQ0, DQ1 allocated to them. On the other hand, if the memory is in the block-writing mode of operation, the block-writing signal BW is at high level and, when the word selection line W0 is selected, only those associated byte selection lines CSL0, CSL1 are selected whose masking signal DEQ0, DEQ1 is not active. In this configuration, a masking signal is active in this exemplary embodiment if it is at low level, that is to say ground level.

To produce the logic function just described, the masking decoder 10 shown partially in FIG. 3 has an OR gate OR0, OR1 for each byte selection line CSL0, CSL1, which is connected to the output of said OR gate. A first input of each OR gate OR0, OR1 is connected to the output of a respective AND gate AND0, AND1. A first input of each AND gate is connected to the word selection line W0, a second input is connected to the block-writing signal BW, and a third input is connected to the respective masking signal DQ0, DQ1. A second input of each OR gate OR0, OR1 is connected to the output of a further AND gate AND2. A first input of the further AND gate AND2 is connected to the word selection line W0. A second input of the further AND gate AND2 receives the block-writing signal BW, inverted by an inverter I.

Having discussed, above, the production of the signals on the byte selection lines CSL0 . . . 35 and the selection of the latter, even more particulars of the memory from FIG. 1A will now be described. In the block-writing mode of operation, it is possible to write a data word W located on the thirty-two external bit lines EBL to all eight words W of one of the word blocks WB at the same time. This is done in that, when a column address CADR is applied, its three least significant address bits are not evaluated by the column decoder CDEC if it recognizes, with the aid of the block-writing signal BW also supplied to it, that the memory is in the block-writing mode of operation. The three least significant bits of a column address CADR actually allow the individual words W within a word block WB to be distinguished. Accordingly, if they are suppressed, all eight word selection lines W0 . . . . 7 for one of the word blocks WB are selected at once by the column decoder CDEC. If none of the masking signals DQ0 . . . 31 is then active, the eight word selection lines W0 . . . 7 are used to select all thirty-two byte selection lines CSL0 . . . 31 for the first word block WB. In this manner, a data word W transferred to the external bit line EBL by the global write/read amplifiers SSA can be simultaneously written to eight memory words W of the memory.

The thirty-two masking signals DQ0 . . . 31 allow any desired bytes B within each of the word blocks WB to be masked. Masking causes the corresponding memory cells MC not to be overwritten by the masked byte on the external bit lines EBL.

As explained below with reference to FIGS. 7 and 8, in the block-writing mode of operation, the thirty-two external connections I/O are not required for supplying the data word that is to be written. Instead, they are used in the block-writing mode of operation to supply the thirty-two masking signals DQ0 . . . 31, which do not need to be supplied in the normal mode of operation. Hence, no additional external connections are necessary for supplying the masking signals.

Figure 7:
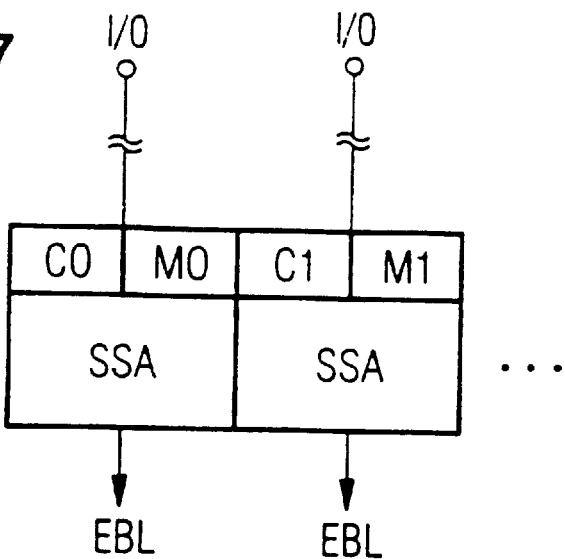
FIG. 7 is a block circuit diagram of two global write/read amplifiers and associated 1-bit color and masking registers.

FIG. 7 shows that each global write/read amplifier SSA, which is connected firstly to one of the external connections I/O and secondly to one of the external bit lines EBL, is allocated a 1-bit color register C0; C1 and a 1-bit masking register M0; M1. FIG. 7 shows the topological configuration of these registers and of the associated global write/read amplifiers SSA for two of the thirty-two global write/read amplifiers SSA. The registers C0, M0; C1, M1 are immediately adjacent to the respective global write/read amplifiers SSA, so that signal delay times between the registers and the amplifier are practically negligible.

Figure 8:
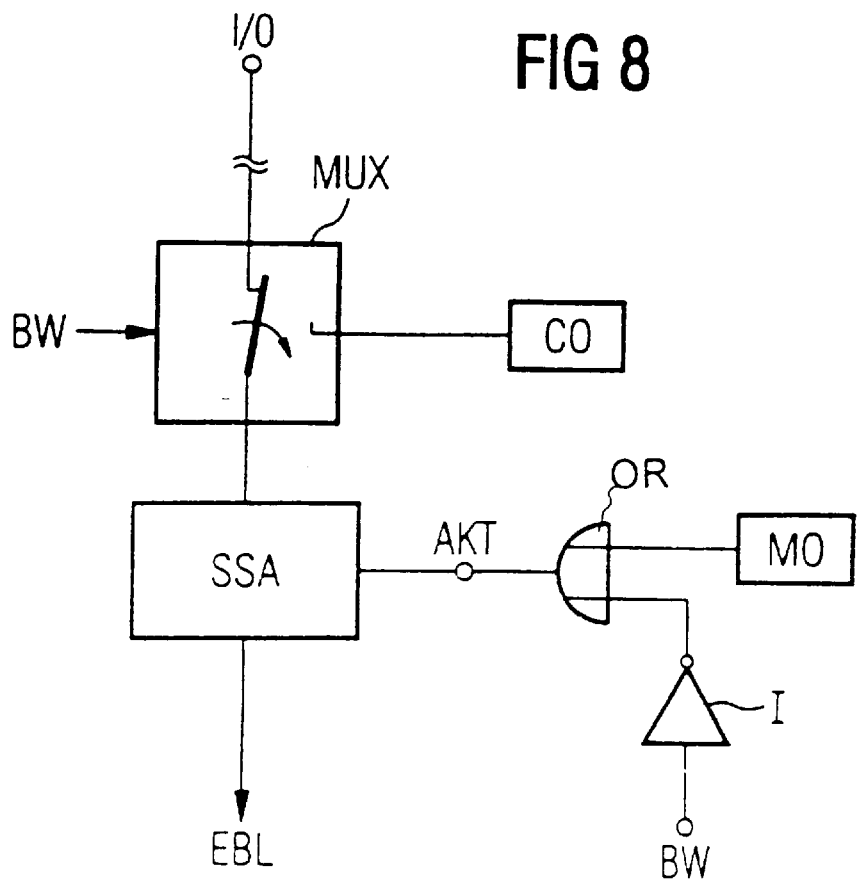
FIG. 8 is a block circuit diagram of a detail from FIG. 7 relating to one of the global write/read amplifiers.

FIG. 8 is now used to explain the operation of the color register C0 and of the masking register M0 for one of the global write/read amplifiers SSA. The global write/read amplifier SSA is firstly connected via a multiplexer MUX to one of the external connections I/O and to the color register C0, and secondly to one of the external bit lines EBL. The multiplexer MUX is controlled by the block-writing signal BW. In the normal mode of operation, data can be transferred between the external connection I/O and the amplifier SSA via the multiplexer MUX. In the block-writing mode of operation, whenever the block-writing signal BW is at high level, the content of the color register C0 can be transferred to the global amplifier SSA via the multiplexer MUX. An activation input AKT of the global write/read amplifier SSA is connected to the output of an OR gate OR. A first input of the OR gate OR is connected to the block-writing signal BW via an inverter I, and a second input is connected to an output of the masking register M0.

If the memory is in the normal mode of operation, that is to say the block-writing signal BW is at low level, the level at the activation input AKT is high and the global write/read amplifier SSA is thus activated. It is then able to transfer data supplied by the multiplexer to the external bit line EBL. On the other hand, if the memory is in the block-writing mode of operation, in which the block-writing signal BW is at high level, the amplifier SSA is only activated if a "1" is stored in the masking register M0. In this case, the bit stored in the color register C0 can be transferred to the external bit line EBL via the multiplexer MUX and the amplifier SSA. On the other hand, if a logic "0" is stored in the masking register M0, the global amplifier SSA is constantly deactivated in the block-writing mode of operation, so that the content of the color register C0 cannot be transferred to the external bit line EBL. Hence, the bit line BL selected simultaneously by the column decoder CDEC in this case receives no data item to be newly written, so that the content of the respectively selected memory cell MC is maintained and is written back amplified to the memory cell by the local write/read amplifier SA in a manner known to the person skilled in the art.

Whereas, then, the masking signals DQ0 . . . 31 allow byte-wise masking in the block-writing mode of operation, the masking registers M0, M1 enable bit-wise masking. The content of the color registers C0, C1 and masking registers M0, M1 is written to them via the external connections I/O at the start of the block-writing mode of operation.

Figure 1B:
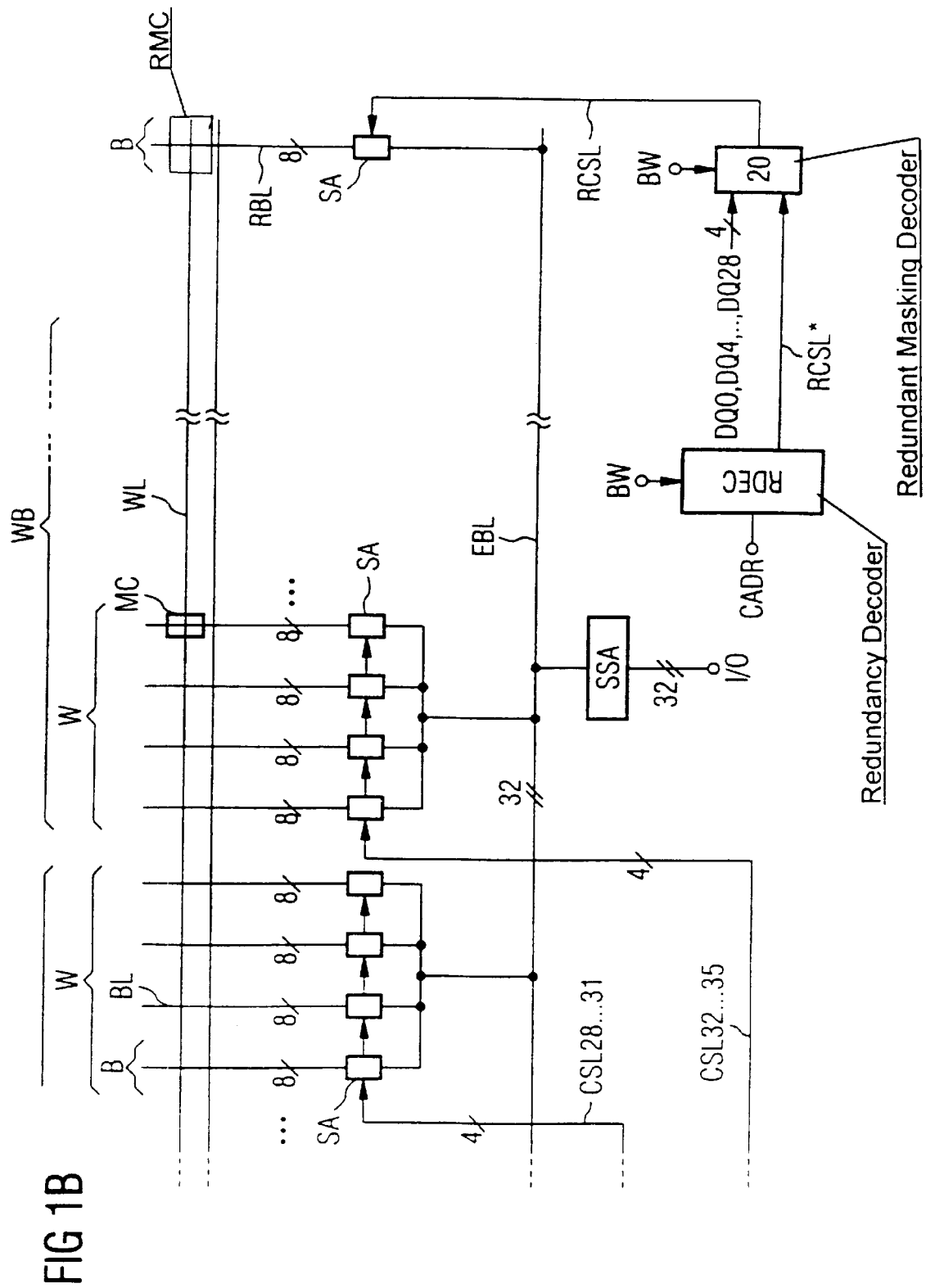

FIG. 1B shows even more components, which have not yet been discussed. To replace a faulty bit line group of eight bit lines BL, which is allocated to a byte B, the memory according to the invention has eight redundant bit lines RBL with corresponding local write/read amplifiers SA and redundant memory cells RMC.

When a column address CADR for a faulty byte selection line is applied, a redundancy decoder RDEC programmed to this address is used to select a redundant byte selection line RCSL which activates the local amplifiers SA for the redundant bit lines RBL. At the same time, the redundancy decoder RDEC ensures that the byte selection line CSL0, CSL4 . . . 28 with the corresponding address is not selected by the column decoder CDEC.

Such column redundancy, in which one or more bit lines are replaced, using addressing, by redundant lines, including the configuration of a redundancy decoder and suppression of the selection of the lines to be replaced in each case, is known sufficiently to a person skilled in the art. Hence, the following text deals only with the peculiarities essential for the invention.

To be able to perform the byte-wise masking, described above, in the block-writing mode of operation in the case of redundancy as well, that is to say in the case in which faulty bit lines BL are replaced by the redundant bit lines RBL, the memory in FIG. 1B has a redundant masking decoder 20 which is supplied with the output signal of the redundancy decoder RDEC. The redundant masking decoder 20 is supplied the block-writing signal BW and the masking signals DQ0, DQ4, . . . ,DQ28, which are allocated to the respectively first byte B within the eight words W of each word block WB. The operation of the redundant masking decoder 20 is explained further below with the aid of FIGS. 5 and 6.

The redundant bit lines RBL shown in FIG. 1B are used only to replace those bit lines BL, within any desired one of the word blocks WB, that are allocated to one of the masking signals DQ0, DQ4, . . . ,DQ28 supplied to the redundant masking decoder 20. The illustration does not show that the memory contains a large number of such redundant bit line groups with associated redundant masking decoders 20. In reality, the memory in FIG. 1B contains, for each of the four byte positions within the words W, at least one group of redundant bit lines RBL and an associated redundant masking decoder 20 which in each case receives the corresponding eight masking signals for this byte position within the words W of each word block WB.

When a word address CADR to which the redundancy decoder RDEC is programmed is used, the signal RCSL at the output of the redundancy decoder is activated (if no masking occurs). This then deactivates all the byte selection lines CSL0, CSL4 . . . 28 allocated to the corresponding byte position. This prevents the byte selection line that is to be replaced from being selected by the column decoder CDEC on which the word address CADR is likewise present. This deactivation is not shown in FIG. 1B.

FIG. 5 shows the redundancy decoder RDEC from FIG. 1B and the redundant masking decoder 20. The redundancy decoder RDEC is supplied the column address CADR. The redundancy decoder contains storage elements F in the form of breakable connections, so-called fuses, for setting the column address of the bit line group that is to be replaced in each case. The redundancy decoder RDEC has a comparison device COMP which compares the respectively present column address CADR with the address stored by the storage elements F. If the comparison device COMP recognizes that the two addresses concur, it activates a line RCSL*. This line is connected to the redundant byte selection line RCSL via an n channel transistor T. The gate of the transistor T is connected to a redundant masking signal RQ that forms an output signal from the redundant masking decoder 20. This will be discussed further below with reference to FIG. 6. The redundant byte selection line RCSL is masked, that is to say not selected despite addressing by the column address CADR, if the redundant masking signal RQ is at low level and hence the transistor T is turned off. The invention provides for the redundant masking signal RQ to concur with that masking signal DQ0 . . . 31 that is allocated to the byte selection line CSL0 . . . 35 replaced in each case by the redundant byte selection line RCSL.

FIG. 5 shows only three of the storage elements F. As already mentioned, the storage elements F are so-called fuses in this exemplary embodiment. The storage element F with the cell A0=1 is an intact fuse, whereas the two storage elements F with the cells A1=0 and A2=0 represent "blown" fuses. The latter fuses have been severed using a laser beam or a surge pulse during programming of the redundancy decoder RDEC. The three fuses shown in FIG. 5 are allocated to the three least significant address bits A0, A1, A2 of the column address CADR. These three least significant address bits indicate the number of that word W in a word block WB within which a replacement has been carried out by the redundant bit lines RBL. As explained in the following text with reference to FIG. 6, this information is used to ascertain, inside the redundant masking decoder 20, which of the masking signals DQ0, DQ4, . . . ,DQ28 supplied to the latter is output as a redundant masking signal RQ at its output.

Figure 6:
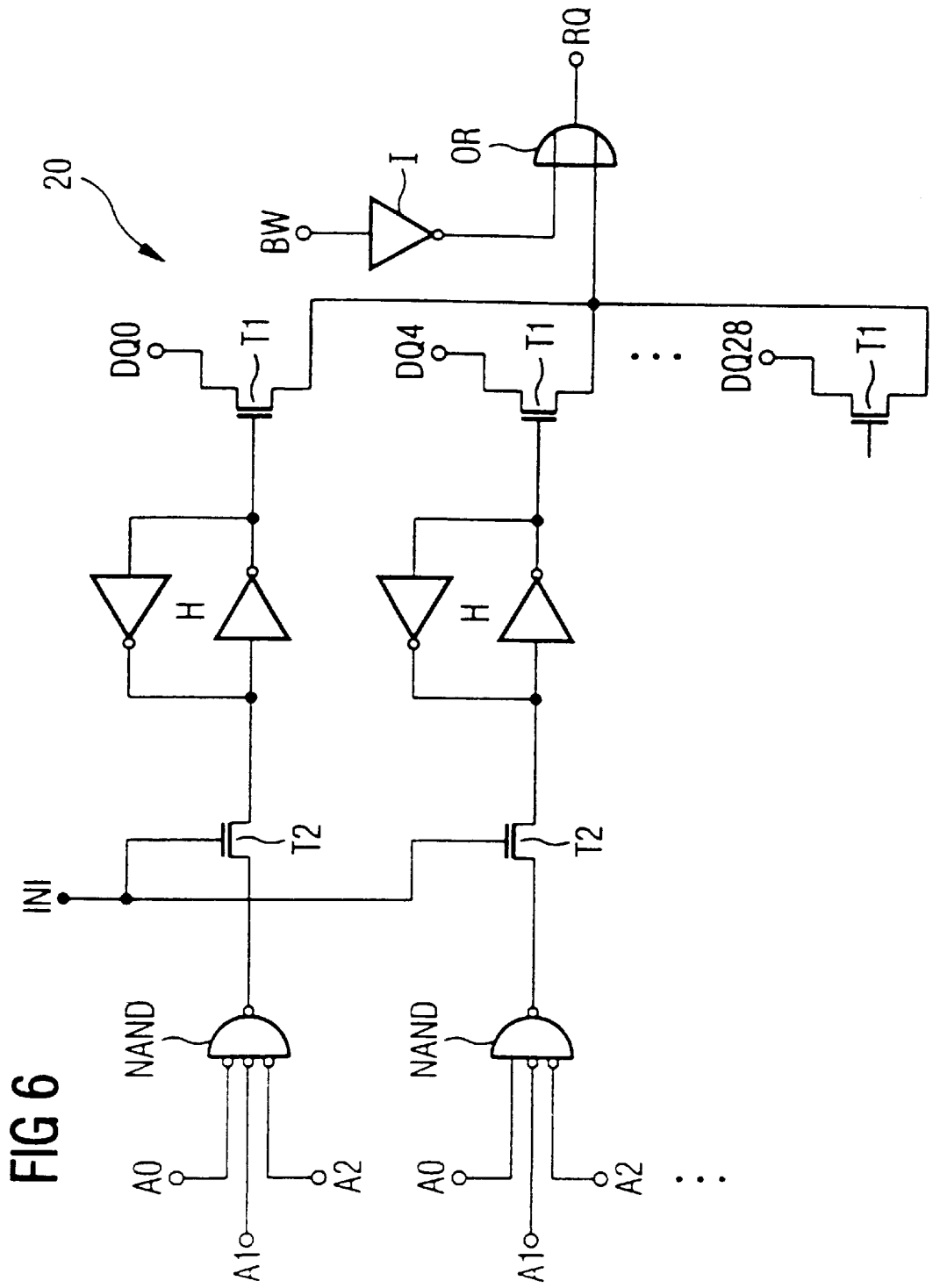
FIG. 6 is a circuit diagram of a detail from FIG. 5 relating to a redundant masking decoder.

FIG. 6 shows the redundant masking decoder 20 from FIG. 5. At its output, which has an OR gate OR connected upstream of it, it supplies the redundant masking signal RQ. A first input of the OR gate OR is connected to the block-writing signal BW via an inverter I. Hence, in the normal mode of operation, in which no byte-wise masking is intended to take place, the level of the redundant masking signal RQ is constantly high. Thus, the signal is inactive. In the block-writing mode of operation, on the other hand, the block-writing signal BW is at high level, so that the level of the redundant masking signal RQ depends on the level at the second input of the OR gate OR. This gate is connected via the conducting path of a respective first transistor T1 to a respective one of the masking signals DQ0, DQ4, . . . ,DQ28 supplied to the redundant masking decoder 20.

Allocation of one of these masking signals to the redundant masking signal RQ now takes place in the following manner: the redundant masking decoder 20 has eight NANDs each having three inputs to which the three least significant address bits A0, A1, A2 stored in the redundancy decoder RDEC from FIG. 5 are supplied. Overall, this is a 1-of-8 decoder controlled by these three least significant address bits. In the programmed state of the storage elements F, which is shown in FIG. 5 and in which the address bits have the values A0=1, A1=0 and A2=0, only the second NAND from the top, in which only the inputs allocated to the addresses A1 and A2 are inverted, has low level at its output.

The output of each NAND is connected to the gates of the first n channel transistors T1 via the conducting path of a second n channel transistor T2 and a hold circuit H. The gates of the second transistors T2 are connected to an initialization signal INI which is at high level only in an initialization phase of the memory. During this initialization, the output signal from the respective NAND is generated as a function of the address bits A0, A1, A2, transferred via the second transistor T2 to the hold circuit, and stored by the latter, at which juncture the initialization signal INI assumes low level again. In the present case, the only first transistor T1 which turns on is the one which is allocated to the masking signal DQ4 for the first byte B of the second word W within the respective word block WB, since only the output of the NAND allocated to said transistor is at low level.

The hold circuit H ensures that the three address bits A0, A1, A2 have to be evaluated only once during initialization of the memory. It guarantees that the corresponding first transistor T1 is turned on throughout operation of the memory, so that, in the block-writing mode of operation, the redundant masking signal RQ is always at the same level as the masking signal DQ4 allocated to it. Since the redundant masking signal RQ is not generated only when the redundant byte selection line RCSL is addressed, but rather during initialization of the memory, very rapid redundancy access is guaranteed.

We claim:

1. An integrated memory, comprising:

word lines;

bit lines intersecting said word lines;

memory cells disposed at intersection points of and connected to said word lines and said bit lines for storing bits, a number of said bits in each case forming a byte and a number of bytes in each case forming a word;

byte selection lines, each of said byte selection lines upon being addressed selecting all of said bit lines of a respective byte;

masking decoders connected to said byte selection lines and generating byte addressing signals outputted on said byte selection lines for addressing said byte selection lines;

masking signals received by said masking decoders and allocated to a respective byte in at least one of a multiplicity of words;

word selection lines;

a column decoder connected to said masking decoders via said word selection lines, said column decoder outputting word address signals on word selection lines, if addressed, each of said word selection lines causing all of said byte selection lines for one of said multiplicity of words to be simultaneously selected if none of said masking signals are active; and each of said masking signals, if activated, preventing an addressed one of said word selection lines from selecting a respective byte selection line allocated to a corresponding byte of a corresponding word.

2. The memory according to claim 1, including local write/read amplifiers connected to said byte selection lines and to said bit lines, said local write/read amplifiers activated by said byte address signals carried on said byte selection lines and transfer data from and to said bit lines, each of said masking signals, if activated, preventing said local write/read amplifiers allocated to an associated byte from being activated by a respectively addressed word selection line by suppressing a selection of an associated byte selection line.

3. The memory according to claim 2, including:

I/O connections;

global write/read amplifiers connected to said local write/read amplifiers and said I/O connections, said global write/read amplifiers in a first mode of operation ransferring data between said I/O connections and at least one of said local write/read amplifiers which in turn transfer the data in each case to one of said bit lines; and a 1-bit color register having a content connected to each of said global write/read amplifiers, the content of said 1-bit color register being transferred, in a second mode of operation, to at least one of said local write/read amplifiers via said corresponding global write/read amplifiers.

4. The memory according to claim 3, including a masking register connected to each of said global write/read amplifiers and storing a masking bit, the masking bit having a deactivating state for deactivating said global write/read amplifiers when a corresponding 1-bit color register is read so that the content of said corresponding 1-bit color register is not transferred to one of said local write/read amplifiers.

5. The memory according to claim 1, including:

redundant bit lines intersecting said word lines;

redundant memory cells disposed at intersection points of and connected to said word lines and said redundant bit lines for storing redundant bits, a number of said redundant bits in each case forming a redundant byte;

at least one redundant byte selection line for selecting said redundant bit lines for replacing one of said byte selection lines and associated bit lines; and a redundant masking decoder connected to said at least one redundant byte selection line and producing a redundant masking signal, said redundant masking signal, if active, preventing a selection of said at least one redundant byte selection line if said at least one redundant byte selection line is addressed, said redundant masking decoder receiving at least some of said masking signals and producing and outputting said redundant masking signal to correspond to a masking signal of a replaced byte selection line.

6. The memory according to claim 5, including a redundancy decoder having storage elements for storing an address of said one of said byte selection lines replaced by said at least one redundant byte selection line, said redundancy decoder connected to said redundant masking decoder; and said redundant masking decoder allocating one of said masking signals received by said redundant masking decoder as said redundant masking signal after evaluating the address stored in said storage elements.

7. The memory according to claim 6, wherein said redundant masking decoder allocates received said masking signals as said redundant masking signal by evaluating only those bits of the address stored by said storage elements that indicate the number of said word within any one of said word blocks, and resulting in a byte selection line being in each case replaced by said at least one redundant byte selection line.

8. The memory according to claim 5, wherein:

a number of words are combined to form word blocks;

each of said masking signals is allocated to a respective one of said bytes at a specified position within each of said word blocks;

said at least one redundant byte selection line is used only to replace said byte selection lines that are allocated to said byte at a specified position within any one of said words; and said redundant masking decoder receiving only said masking signals that are allocated to said byte having said specified position within any one of said words.

9. The memory according to claim 8, wherein each byte position within any one of said words has said at least one redundant byte selection line with associated said redundant bit lines and a corresponding redundant masking decoder receiving in each case only said masking signals corresponding to a respective byte position.

10. The memory according to claim 8, wherein said redundant masking decoder has volatile storage units for storing an allocation of said redundant masking signal to one of said masking signals after the address stored by said storage elements has been evaluated.

\* \* \* \* \*